US007081420B2

(12) United States Patent
Kamata et al.

(10) Patent No.: US 7,081,420 B2
(45) Date of Patent: Jul. 25, 2006

(54) METHOD FOR PREPARING SIC CRYSTAL AND SIC CRYSTAL

(75) Inventors: Isaho Kamata, Kanagawa (JP); Hidekazu Tsuchida, Kanagawa (JP)

(73) Assignee: Central Research Institute of Electric Power Industry, Tokyo (JP)

(*) Notice: Subject to any disclaimer, the term of this patent is extended or adjusted under 35 U.S.C. 154(b) by 0 days.

(21) Appl. No.: 10/508,130

(22) PCT Filed: Mar. 19, 2003

(86) PCT No.: PCT/JP03/03363

§ 371 (c)(1),
(2), (4) Date: Sep. 16, 2004

(87) PCT Pub. No.: WO03/078702

PCT Pub. Date: Sep. 25, 2003

(65) Prior Publication Data

US 2005/0181627 A1    Aug. 18, 2005

(30) Foreign Application Priority Data

Mar. 19, 2002  (JP) ............... 2002-075956
Aug. 13, 2002  (JP) ............... 2002-235865

(51) Int. Cl.
*H01L 21/31*  (2006.01)
(52) U.S. Cl. ............... 438/778; 438/149; 117/90; 117/95

(58) Field of Classification Search .......... None
See application file for complete search history.

(56) References Cited

U.S. PATENT DOCUMENTS 6,214,107 B1 *  4/2001  Kitabatake ................ 117/95

OTHER PUBLICATIONS

Tsuchida, et al, LPCVD Growth and Structural Properties of 4H-SiC Epitaxial Layers, Materials Science Forum, 1999, p. 145-148, vols. 338-342, Trans Tech Publications, Switzerland.

(Continued)

*Primary Examiner*—Dung A. Le
(74) *Attorney, Agent, or Firm*—Notaro & Michalos PC

(57) ABSTRACT

A process for closing hollow-core defects, called micropipes, during growth by CVD of a SiC crystal on a SiC single crystal substrate having hollow-core defects, and a crystal obtained according to the process, by contacting the SiC crystal with a source gas adjusted to a C/Si atom ratio range in which the crystal growth rate is determined by the carbon atom supply limitation, then epitaxially growing and laminating a plurality of SiC crystal layers, wherein hollow-core defects in the SiC single crystal substrate dissociate into a plurality of dislocations given by small Burghers vector in order not to propagate to the crystal surface. In addition, the present invention provides a fabrication process of a SiC crystal, wherein a first SiC crystal is made as a buffer layer, and a further SiC crystal is layered thereon using a source gas adjusted to be higher than that of the C/Si ratio when forming the buffer layer, whereby a desired film property is conferred.

28 Claims, 11 Drawing Sheets

OTHER PUBLICATIONS

Matsumami, SiC Wafer, Sic Semiconductor Device and SIC Wafer Production Method, WO00/68474, 1999, Cover page.

Tsvetkov, et al, SIC Seeded Boule Growth, Materials Science Forum, 1998, p. 3-8, vols. 264-268, Trans Tech Publication, Switzerland.

Okamoto, et al, Method for Manufacturing Single Crystal of Silicone Carbide, EP0967304, 2000, Cover Page.

Thesis of Inventors, Nov. 2002.

Thesis of Inventors, Nov. 15, 2002.

Thesis of Inventors, Mar. 27, 2002.

Thesis of Inventors, Jul. 11, 2002.

* cited by examiner

15

13

US 7,081,420 B2

METHOD FOR PREPARING SIC CRYSTAL AND SIC CRYSTAL

This application is a 371 of PCT/JP03/03363 Mar. 19, 2003.

TECHNICAL FIELD

The present invention relates to a fabrication process of a SiC crystal having a reduced number of hollow-core defects, which are called micropipes, in the SiC substrate. The present invention further relates to the SiC crystal and a SiC single crystal film obtained from such a fabrication process, a SiC semiconductor device and a SiC single crystal substrate comprising such a SiC single crystal film, an electronic device using such a SiC single crystal substrate, and a fabrication process of a SiC bulk crystal which uses the above described SiC crystal as a seed crystal.

BACKGROUND ART

Research has been progressing into silicon carbide SiC as a semiconductor device for high performance power devices or as a substrate for devices having high voltage, low-loss and which are operable at high temperatures in view of silicon carbide SiC's excellent physical properties of wide bandgap, a high reverse blocking voltage and high thermal conductivity.

To produce a SiC semiconductor device, a SiC single crystal having a doping concentration-controllable SiC single crystal film formed on a SiC single crystal substrate is often used. For this reason, forming the SiC single crystal film on the SiC single crystal substrate by epitaxial growth using chemical vapor deposition (CVD) is performed. In CVD, a source gas containing gaseous carbon and silicon atoms is supplied onto a SiC single crystal substrate under high temperature and normal or reduced pressure to form a SiC single crystal film on the SiC single crystal substrate.

Currently, the SiC single crystal substrate used for forming the SiC single crystal film is a commercially available SiC single crystal substrate formed by sublimation. A SiC single crystal substrate 100 such as this comprises micropipes (hollow-core defects) 101 in a high density of $10^1$ to $10^3/cm^2$, as illustrated in FIG. 13A. When forming the SiC single crystal substrate 100 by sublimation, screw dislocations 102, as illustrated in FIG. 13A, are generated in a huge number. Among them, the screw dislocations 104 in FIG. 13B having a small Burghers vector, which is described as the one unit of step gap, do not become hollow-cores, while the screw dislocations 104 having a large Burghers vector 105 become hollow-cores to reduce their core energy, whereby micropipes 101 are formed. In other words, micropipes 101 are large screw dislocations 104.

As illustrated in FIGS. 9 to 12, during epitaxial growth by CVD these micropipes (hollow-core defects) can propagate without being closed. Even for bulk growth by sublimation, because micropipes propagate from the seed crystal to the bulk crystal, in newly formed crystals during bulk growth, micropipes replicate in the same density as in the substrate and the seed crystal. The micropipes in FIGS. 9 to 12 are described as having three unit of steps of the Burghers vector (one unit of the step is the height of one unit of SiC lattice).

A semiconductor device containing micropipes 101, as illustrated in FIG. 8, does not satisfy the necessary characteristics of a semiconductor device in terms of breakdown voltage, so that a semiconductor device that contains even one micropipe 101 is treated as a defective device. For this reason, the ratio of non-defective devices among all semiconductor devices (yield) is strongly influenced by the micropipe density of the SiC single crystal substrate 100. When the surface area of the semiconductor device is enlarged, the probability that micropipes 101 will be contained within the semiconductor device area increases, meaning that yield drops, which is an obstacle to enlarge the device area. When a semiconductor device is fabricated using an epilayer grown on the SiC single crystal substrate 100 which contains a large number of micropipes 101, a large number of small surface area electrodes have to be formed on the SiC crystal film 103 in order to obtain a semiconductor device which does not contain micropipes 101, which is very troublesome. Accordingly, a low-defect, if possible a zero-defect, SiC single crystal film is desired.

To obtain a doping concentration-controllable SiC single crystal film, a technique is employed for controlling the crystal dopant concentration which lowers the amount of impurities that are unintentionally mixed therein as far as possible, then from that state flows a predetermined flow amount of, for example, nitrogen gas or the like for an n-type. For a p-type, a gas containing aluminum or the like is employed. Therefore, the fabrication of a film having a low amount of impurities unintentionally mixed therein (high purity SiC film) is required.

To fabricate a semiconductor device using the formed SiC single crystal and carry out secondary crystal growth, the surface shape (morphology) of the SiC single crystal film is preferably as smooth as possible.

It is an object of the present invention to provide a SiC crystal, and the fabrication process thereof, having a reduced number of hollow-core defects, called micropipes, that have propagated from a SiC single crystal substrate, even if a SiC single crystal substrate having hollow-core defects is used.

It is another object of the present invention to provide a SiC single crystal film and a SiC single crystal substrate, which have a reduced number of hollow-core defects that have propagated from the substrate and that can be doped with a predetermined concentration of dopant.

It is a further object of the present invention to provide a SiC semiconductor device and an electronic device.

It is another object of the present invention to provide a fabrication process of SiC bulk crystal having a reduced number of hollow-core defects.

DISCLOSURE OF THE INVENTION

As a result of intensive research to achieve the above-described objects, the present inventors found that when a SiC crystal was epitaxially grown on a commercially available SiC single crystal substrate by chemical vapor deposition (CVD), micropipe continuation could be controlled better by setting the value for the C/Si atom number ratio (referred to in the specification as simply C/Si ratio) in a source gas so that the silicon atom number was in excess, rather than the value which formed the most pure SiC crystal film. That is, the present inventors found that the crystal growth rate depended on the magnitude of the source gas C/Si ratio, wherein below a certain value the crystal growth rate became carbon-limited and slows; that the closing probability of micropipe defects depended on the C/Si ratio magnitude, in other words the speed of crystal growth rate, wherein when the above-described crystal growth rate was within the carbon-limited range the closing probability suddenly increased, and within that range as the C/Si ratio dropped the micropipes that had existed in a high density in the SiC single crystal substrate became hardly recognizable;

that the amount of impurity nitrogen in the obtained SiC crystal depended on the C/Si ratio magnitude; and that crystal surface shape (morphology) depended on the C/Si ratio magnitude.

The fabrication process of a SiC crystal according to the present invention is a process which epitaxially grows a SiC crystal under normal or reduced pressure and a temperature of 1400° C. or higher onto a SiC single crystal substrate having hollow-core defects, called micropipes, by supplying a source gas which contains in a carrier gas a carbon atom-containing substance and a silicon atom-containing substance, characterized in that a number ratio of the carbon to silicon atoms (C/Si ratio) in the source gas is adjusted to be in such a range that crystal growth rate is determined by the carbon atom supply limitation, a plurality of layers of the SiC crystal are epitaxially grown and layered, wherein the hollow-core defects having been present in the substrate dissociate into a plurality of dislocations given by small Burgers vector without any hollow-cores, whereby hollow-core defects that have been present in the substrate do not propagate to the SiC crystal surface. Here, epitaxial growth is carried out by either step-flow mode or spiral growth, preferably by step-flow mode.

The above described fabrication process of a SiC crystal encompasses a fabrication process wherein epitaxial growth is carried out at at least two C/Si ratios that are properly adjusted. In such a case, at least first and second layers of SiC crystal can be obtained at at least two C/Si ratios properly adjusted, wherein both of the at least first and second layers may be formed at C/Si ratios adjusted within a supply range rate-determined by the carbon atom supply limitation, or at least one of the layers may be formed in such a supply range rate-determined by the carbon atom supply limitation. In whichever case, a SiC crystal can be obtained in which micropipes are closed. The fabrication process is a process wherein the at least 2 C/Si ratios are a C/Si ratio for epitaxially growing a first layer on the SiC single crystal substrate and a higher C/Si ratio for epitaxially growing a second layer thereon. It is also a fabrication process wherein the first layer layered on the SiC single crystal substrate is made a buffer layer, and a second layer thereon is epitaxially grown and layered under a supply condition of a source gas in which the C/Si ratio is adjusted to be higher than that of the C/Si ratio when forming the buffer layer, wherein a desired film property is conferred. It is also a fabrication process wherein the first layer is a buffer layer and the second layer is an active layer. In such a case, a film property can be achieved wherein micropipes are closed, impurity concentration low and preferable for doping control.

The SiC crystal according to the present invention is a SiC crystal fabricated according to the above described processes, characterized in that the number of hollow-core defects that have propagated from the substrate is reduced and that it comprises a desired film property. In addition, this SiC crystal includes a SiC crystal in which a density of hollow-core defects that have propagated from the substrate to the crystal surface is 0 or 1/cm$^2$ or less; or wherein the density is repeatedly 50% or less, preferably 20% or less, with respect to the density in the substrate. The SiC crystal according to the present invention also includes a SiC crystal which comprises these SiC crystals as at least a buffer layer, and a SiC crystal of the present invention is prepared in accordance with the fabrication process according to any one of claims 2 to 5. Still further, in the present SiC crystal, the desired film property is characterized by a layer that does not contain semiconductive impurities above a predetermined amount, or that is doped with a predetermined amount of a dopant.

The SiC single crystal film according to the present invention is a SiC single crystal film fabricated according to the above described processes, characterized in that the number of hollow-core defects that have propagated from the substrate is reduced and in that it comprises a desired film property. The SiC single crystal film encompasses both a SiC single crystal film on the substrate used in the fabrication thereof, and a SiC single crystal film independent from such substrate. Further, the SiC single crystal film according to the present invention includes a film that is an independent SiC single crystal film in which the SiC single crystal substrate has been removed, a film wherein the desired film property is a film property that does not contain semiconductive impurities above a predetermined amount, or that is doped with a predetermined amount of a dopant.

The SiC semiconductor device according to the present invention is characterized in containing a dopant at a controlled concentration.

The SiC single crystal substrate according to the present invention is characterized in comprising the above-described SiC single crystal film.

The electronic device according to the present invention is characterized in comprising the above-described SiC single crystal substrate and an electronic element that is mounted on the substrate.

The fabrication process of a SiC bulk crystal according to the present invention is characterized in using the above-described SiC crystal as a seed crystal in the fabrication process of the SiC bulk crystal.

The fabrication process of a SiC bulk crystal according to the present invention encompasses sublimation deposition and high-temperature CVD.

BRIEF DESCRIPTION OF THE DRAWINGS

FIG. 3 is a plan view illustrating a condition in which micropipes are closed when a SiC single crystal film is formed by step-flow. In FIG. 3, 3A illustrates a straight step for a given step-flow prior to reaching a micropipe, 3B illustrates the straight step when it has reached the micropipe, 3C illustrates the straight step when it has traveled down to a downstream side of the micropipe, 3D illustrates when one screw dislocation has split away, and 3E illustrates when the straight step has further separated from the micropipe;

FIGS. 7A to 7C are microscope photographs illustrating a Schottky diode surface which contains a micropipe, wherein FIG. 7A illustrates prior to voltage being applied, FIG. 7B illustrates an enlarged view of a micropipe thereof, and FIG. 7C illustrates a Schottky diode surface after breakdown during a current-voltage characteristics test at a relatively low reverse voltage;

FIGS. 9A and 9B are pattern diagrams illustrating a condition in which a conventional SiC single crystal film is formed by a step-flow growth mode. The figures illustrate the condition prior to the straight step of the step-flow reaching the micropipe, wherein FIG. 9A is a plan view, and FIG. 9B is a perspective view;

FIGS. 10A and 10B illustrate a condition in which a conventional SiC single crystal film is formed. The figures illustrate the condition when the straight step of the step-flow reaches the micropipe, wherein FIG. 10A is a plan view, and FIG. 10B is a perspective view;

FIGS. 11A and 11B are views illustrating the condition of a conventional SiC single crystal film being formed as it travels to a downstream side of a micropipe, wherein FIG. 11A is a plan view, and FIG. 11B is a perspective view;

FIGS. 12A and 12B are views illustrating the condition of a conventional SiC single crystal film being formed as it further separates from a downstream side of a micropipe, wherein FIG. 12A is a plan view, and FIG. 12B is a perspective view;

FIGS. 13A and 13B are schematic diagrams illustrating a micropipe and a screw dislocation, wherein FIG. 13A is a perspective view of a micropipe, and FIG. 13B is a perspective view of a screw dislocation.

BEST MODE FOR CARRYING OUT THE INVENTION

The fabrication process according to the present invention is a process for epitaxially growing a SiC crystal under normal or reduced pressure and a temperature of 1400° C. onto a SiC single crystal substrate having hollow-core defects, called micropipes, by supplying a source gas which contains in a carrier gas a carbon atom-containing substance and a silicon atom-containing substance, characterized in that the atom number ratio of carbon atoms to silicon atoms (C/Si ratio) in the source gas is adjusted to be in a range in which the crystal growth rate is determined by the carbon atom supply limitation, and that a plurality of layers of SiC crystals are epitaxially grown and layered.

From this characteristic, the hollow-core defects that are present in the SiC single crystal substrate dissociate into a plurality of dislocations having a small Burgers vector that do not result in hollow-cores, which has the advantage that the hollow-core defects present on the substrate no longer propagate to the SiC crystal surface.

It is thought that a reason why such an effect is obtained is that when, for example, a crystal is grown in a step-flow mode, screw dislocations dissociate one unit of step at a time into a plurality of dislocations having a small Burgers vector, due to the interaction of the crystal growth process of the surface step-flow mode and the micropipes, whereby screw dislocations, edge dislocations or partial dislocations, for example, structurally change into other small dislocations and are dispersed. However, when the orientation of the SiC single crystal substrate growing the SiC crystals is a (0001)Si plane, dissociation results in screw dislocation.

Figure 1:
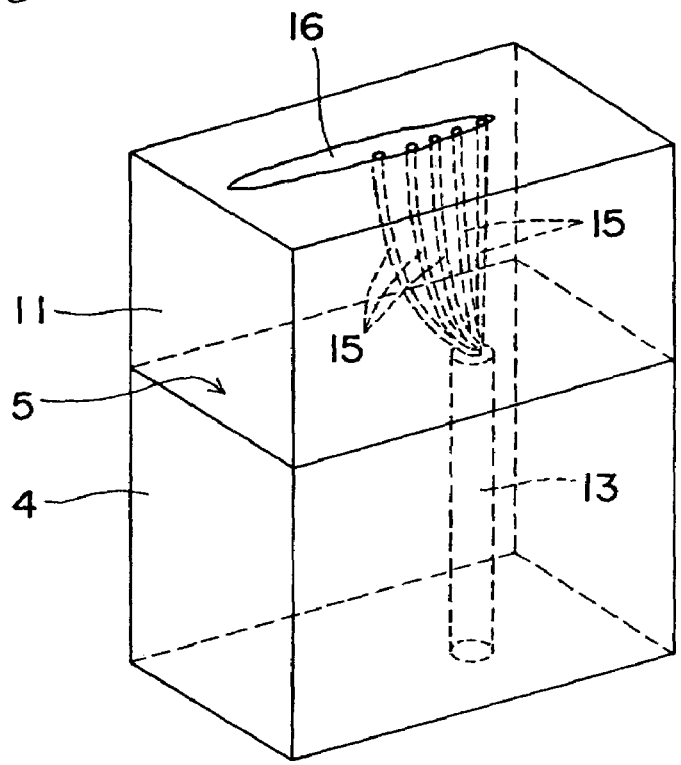
FIG. 1 is a schematic drawing illustrating a SiC crystal formed in accordance with the fabrication process according to the present invention, illustrating a condition in which micropipes that existed in the substrate have closed in the formed SiC crystal, and have dissociated into a plurality of screw dislocations that are not hollow-cores.
Figure 13A:
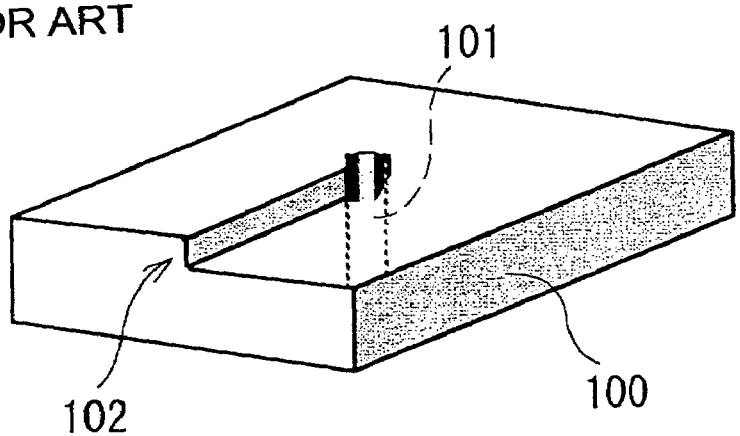
Figure 13B:
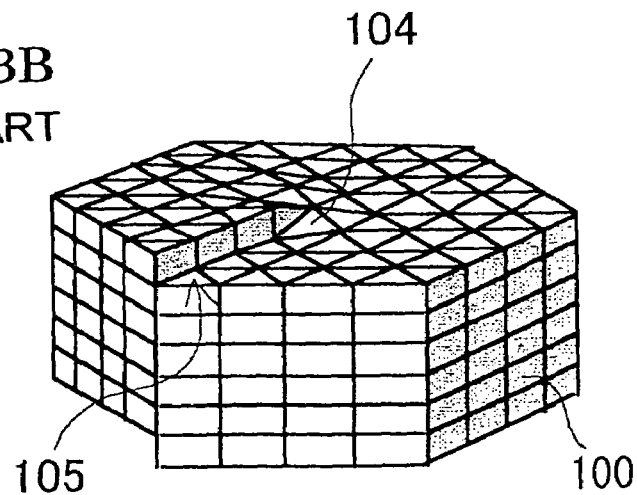

In FIG. 13B, which explains screw dislocation, when the Burgers vector 105 represented by many units of step gap has a large magnitude, the dislocation core becomes a hollow-core to lower the energy of the screw dislocation core, thus forming a micropipe 101 as illustrated in FIG. 13A. On the other hand, when the Burgers vector 105 has a low magnitude, the dislocation core of the screw dislocation 15 does not turn into a hollow-core. Therefore, for the SiC crystal obtained by the fabrication process according to the present invention, as illustrated in the schematic drawing of FIG. 1, the micropipe 13 on the SiC single crystal substrate 4 dissociates into a plurality of screw dislocations 15 that are not hollow-cores. FIG. 1 illustrates that the small screw dislocations 15, which are not hollow-cores, derived from the micropipe 13 that was present on the substrate 4 by epitaxial growth of the SiC crystal 11, are present at the highest flow position of the line-shaped surface defect 16.

Figure 6A:
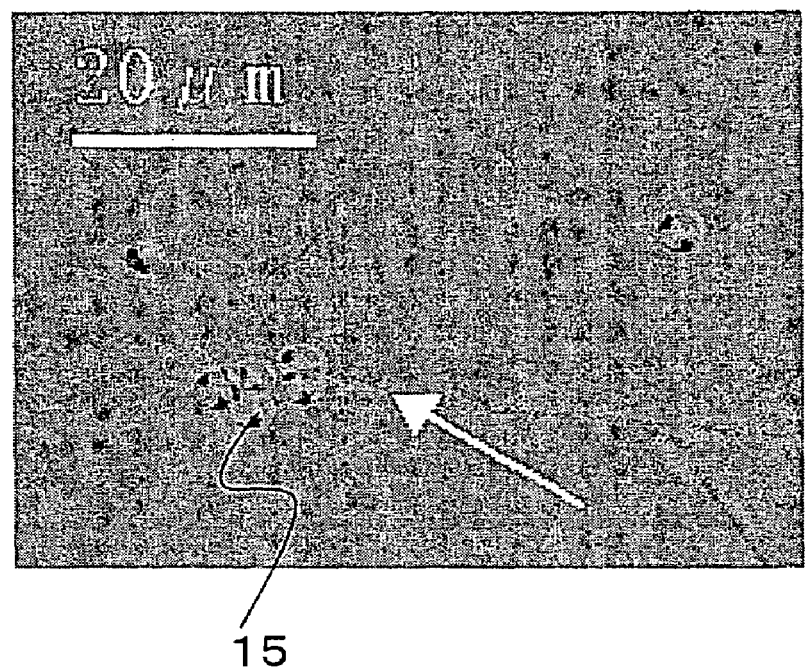
FIG. 6A is a microscope photograph illustrating a plurality of small screw dislocations that have dissociated from micropipe, and FIG. 6B a microscope photograph illustrating a micropipe in SiC single crystal substrate.
Figure 6B:
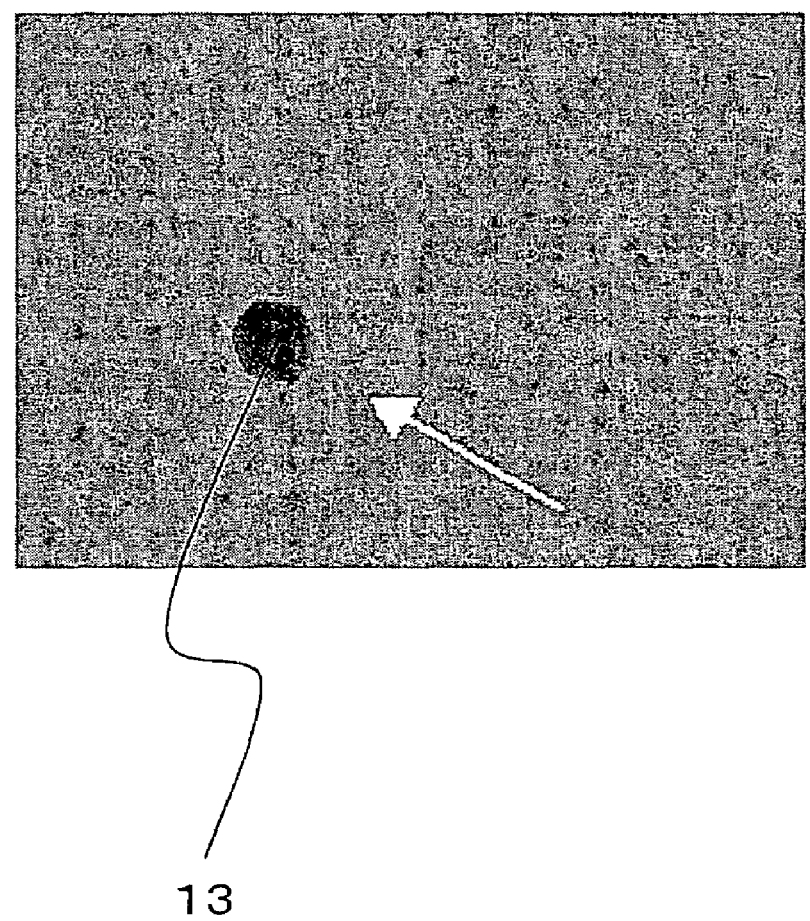

As illustrated in FIG. 6B, hollow-core defects such as these, called micropipes, can be counted by observation using Nomarski optical microscopy after the SiC single crystal substrate or the growth crystal surface has been treated by chemical etching. For a commercially available SiC single crystal substrate, these hollow-core defects are usually present in the order of $10^1$ to $10^3/cm^2$.

Figure 14:
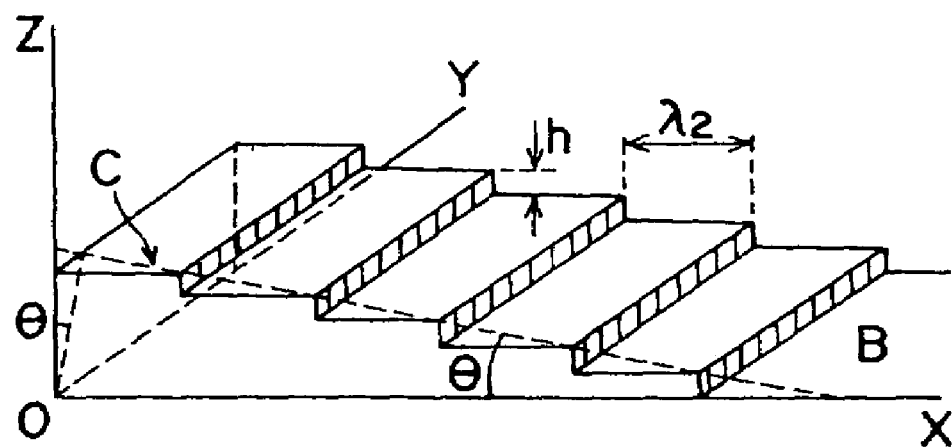
FIG. 14 is a schematic diagram of a SiC single crystal substrate, which illustrates a plurality of terraces and the off-angles thereof provided on the substrate beforehand.

The crystal growth process of the step-flow mode, as shown in FIGS. 3 and 14, means the state in which the steps, which are at the tip of each of the plurality of the terraces 12 provided on the substrate 11, grow in the direction of the arrows.

The mechanism in the present invention for dissociating the micropipe 13 present on the SiC single crystal substrate into several dislocations 15 that have a small Burgers vector magnitude and does not result in micropipes will now be explained based on FIG. 3.

Figure 3A:
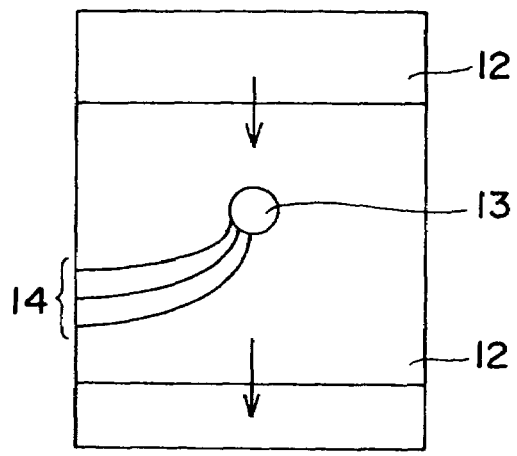
Figure 3B:
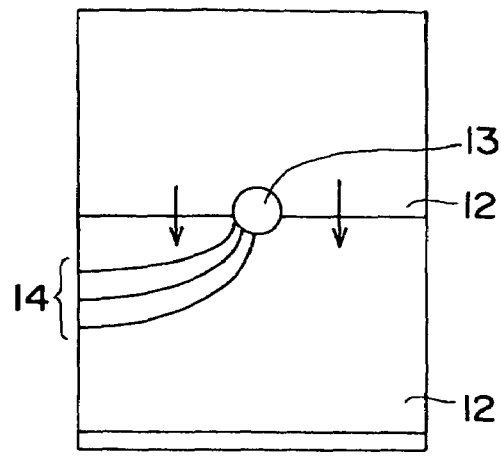
Figure 3C:
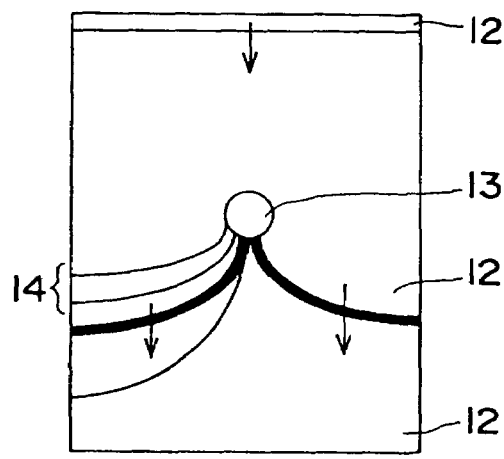
Figure 3D:
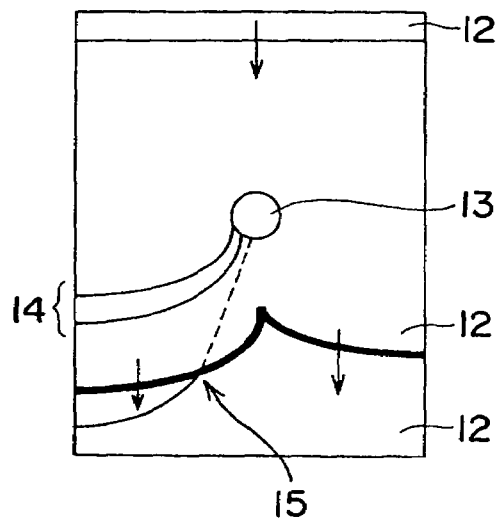
Figure 3E:
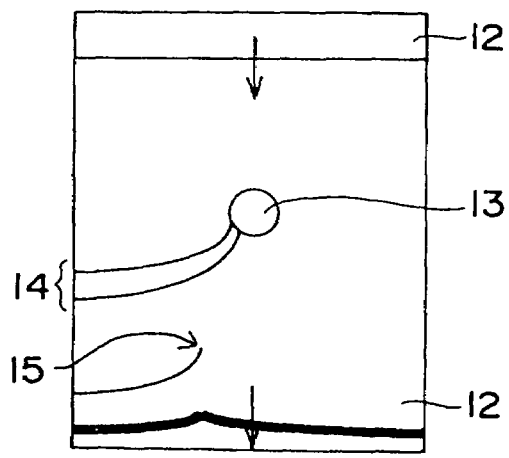

In FIG. 3, the step-flow mode and the micropipe strongly interact (FIG. 3C) when the SiC crystal film 12 grown by step-flow mode (progressing straight line-shaped step) has passed the micropipe 13 (FIG. 3B). In addition, the discrepancy 14 of the crystal surface of the plurality of steps forming the micropipe 13 (FIG. 3D) separates into something like a screw dislocation 15 of 1 unit of step (FIG. 3E, FIG. 1). The micropipe closure is achieved by repeating the process for dissociating into a plurality of screw dislocations.

To grow SiC crystals on the SiC single crystal substrate using this step-flow mode, as shown in FIG. 14, it is required to provide a multi-stepped terrace at a predetermined off angle on the SiC single crystal substrate beforehand. Here, step-flow mode crystal growth means the steps, which are the edges of the multi-stepped terrace 12 arranged on the substrate 11, grow in the direction of the arrows. The off angle is expressed as:

$$\tan \theta = h/\lambda_0$$

wherein $\lambda_0$ represents the length of a terrace 12 in the growth direction and h represents the height of the step of the terrace 12.

The multi-stepped terrace can be provided by angle polishing the SiC single crystal substrate. The off angle is not particularly restricted, and depends on substrate size, the number of steps of the terrace and the like, but usually is 15° or less. Under the growth conditions according to the present invention, from 10° to 6° is preferable and 8° is more preferable. The crystal growth direction may be set in an arbitrary direction such as <11-20> or <1-100>.

A commercially available polytype SiC single crystal substrate such as 4H—SiC or 6H—SiC may be employed as the SiC single crystal substrate, wherein apart from the (0001) Si plane, any orientation of the substrate growing the SiC crystal has the effect of closing micropipes. According to the fabrication process of the present invention, it is important to epitaxially grow the plurality of layers of SiC crystal by adjusting the C/Si atom ratio in the source gas to be in the range where the crystal growth rate is determined by the carbon atom supply limitation. The growth rate, crystal defects, unintentionally mixed impurity nitrogen concentration and surface irregularities of the SiC single crystal film formed on the SiC single crystal substrate are strongly affected by the C/Si ratio. Further, the optimal conditions for this C/Si ratio shift depending on the apparatus, growth temperature, growth pressure, type of substrate employed and others. For the apparatus, growth temperature, growth pressure and substrate employed in the experiments confirming the present invention, the ratio of carbon/silicon atoms (C/Si ratio) in the source gas for the range in which the crystal growth rate was determined by the carbon atom supply limitation during formation of a SiC crystal film by CVD onto a SiC single crystal substrate was 0.8 or less. As shown in FIG. 4B, when the C/Si ratio exceeded 0.8 crystal growth rate was saturated and roughly a fixed value, although when the C/Si ratio was 0.8 or less, because growth was limited by the amount of carbon supplied, it was found that the crystal growth rate slowed due to the carbon atom supply amount, or in other words, the crystal growth rate was determined by the carbon atom supply limitation.

Figure 4A:
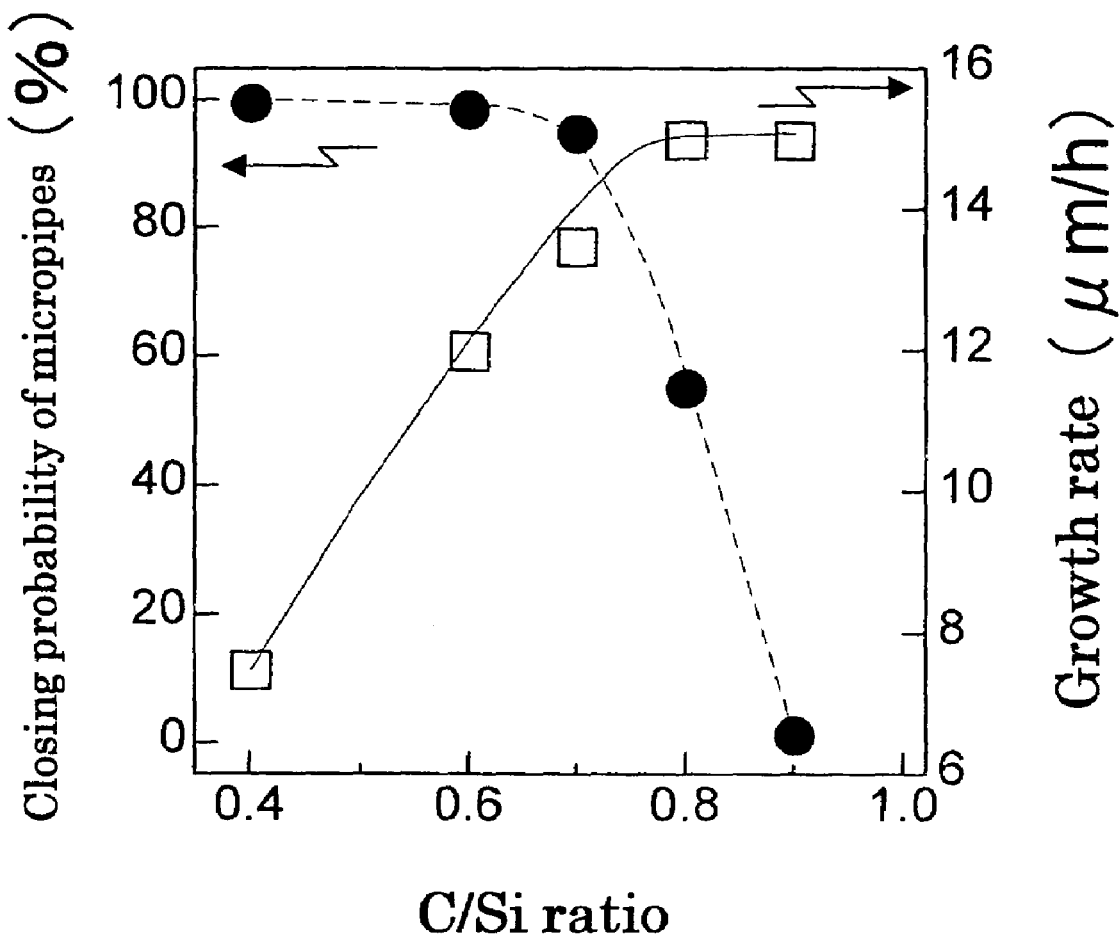
FIG. 4A is a graph illustrating the relationship between C/Si ratio and micropipe closing probability.
Figure 4B:
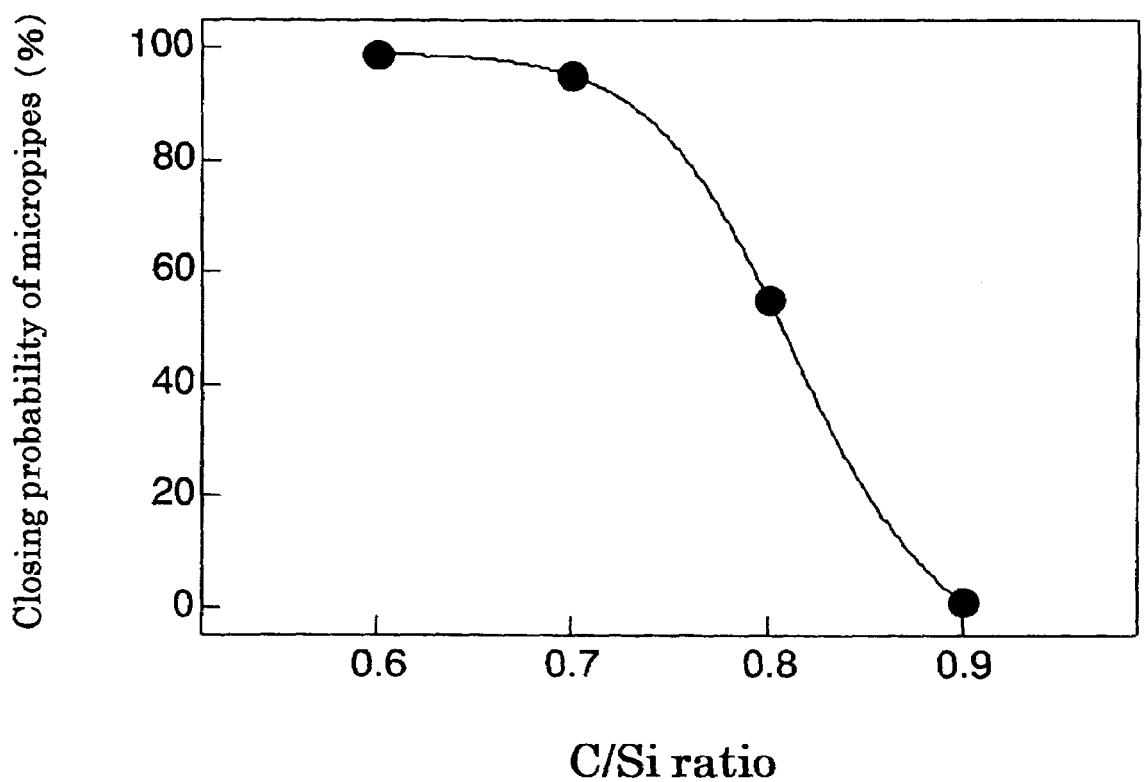
FIG. 4B is a graph further illustrating the relationship between C/Si ratio, and micropipe closing probability and crystal growth rate.

As shown in FIGS. 4A and 4B, at a C/Si ratio of 0.9, while the closing probability of the micropipes present on the SiC single crystal substrate is a low value of about 1%, as the C/Si ratio gets lower the closing probability of the micropipes dramatically increases. In particular at the C/Si ratio of 0.7 where the crystal growth rate is determined by the carbon atom supply limitation, 95% or more of micropipes are closed and at a C/Si ratio of 0.6 almost 100% of micropipes are closed. In addition, even at a C/Si ratio of 0.5 and below, a high probability of micropipe closing can be achieved. Here, the density of hollow-core defects continuing from the substrate to the crystal surface is about 55% (50% or less) of the density in the substrate even for a C/Si ratio of 0.8. If this growth is carried out twice, a closing probability of 75% can be achieved. Adjusting the C/Si ratio in the source gas to be in a range in which the crystal growth rate is determined by the carbon atom supply limitation allows a closing probability of the micropipes to be achieved not found previously. In particular, a C/Si ratio of about 0.75 or less allows for a closing probability of 80% or more.

Therefore, under the growth conditions according to the present invention, to close hollow-core defects the C/Si ratio is 0.8 or less, preferably in the range of from 0.75 to 0.35 and more preferably from 0.6 to 0.4.

It is noted that while a (0001) Si plane substrate was employed in the experiments, even if a low-index plane substrate such as a (000-1) C plane, a (11-20) plane and a (1-100) plane, was employed the micropipe closing effects would still occur. While 4H—SiC was employed in the experiments, even if a polytype substrate such as 6H—SiC, 15R—SiC and 2H—SiC substrate, was employed the micropipe closing effects would still occur. While a (0001) Si plane substrate having an off angle in the <11-20> direction was employed in the experiments, even if a low-index plane substrate such as a (0001) Si plane having an off angle in the <1-100> direction was employed the micropipe closing effects would still occur. While a (0001) Si plane substrate having an off angle of 8° was employed in the experiments, even if a low-index plane substrate such as a (0001) Si plane having an off angle of from 0° to 15° was employed the micropipe closing effects would still occur. While a crystal growth was carried out at a reaction pressure of from 10 to 250 Torr and a temperature of 1500 to 1750° C. in the experiments, even at 1 to 1000 Torr and a temperature of 1400 to 2400° C., the micropipe closing effects would still occur.

In addition, while a vertical reduced-pressure hot-wall reactor was employed in the experiments, growth carried out in a different apparatus, such as a horizontal type or a cold-wall reactor, would still exhibit micropipe closing effects. In such cases, the C/Si ratio of a range in which the crystal growth rate during epitaxial growth is determined by the carbon atom supply limitation would be different from the above described value, and would therefore be appropriately selected.

Thus, the C/Si ratio which closes the micropipes shifts depending on the orientation of the Si substrate, polytype, off direction, off angle, and also the pressure and temperature during growth or the type and shape of the reactor. However, in whichever case, the C/Si atom ratio in the source gas for when micropipes close is in the range in which the crystal growth rate is determined by the carbon atom supply limitation.

Figure 5:
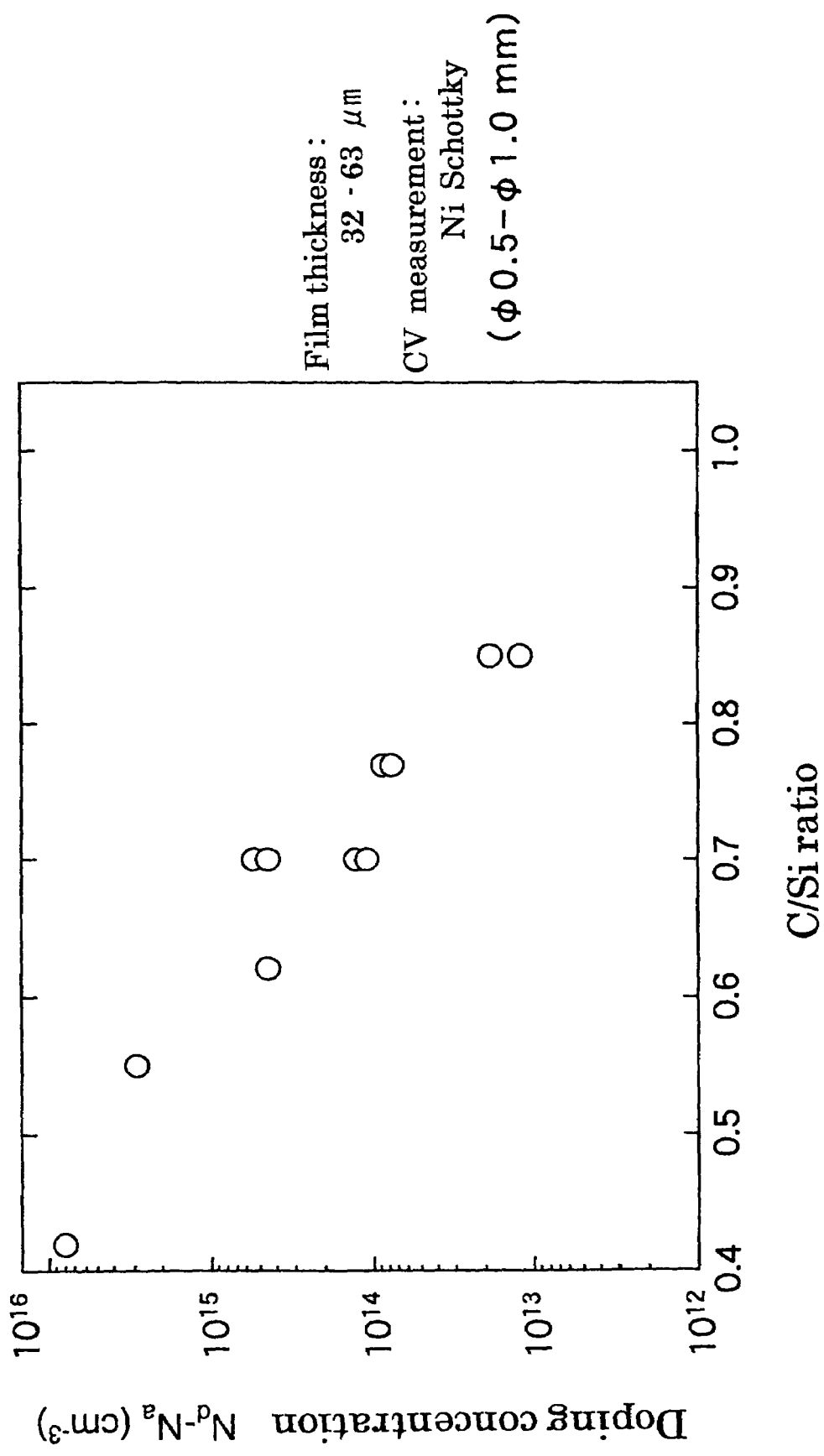
FIG. 5 is a graph illustrating the relationship between C/Si ratio and the contained impurity nitrogen concentration of the SiC crystal.

To employ a SiC crystal in a SiC semiconductor device or for a SiC single crystal substrate, the crystal is required to have a property (hereinafter "film property") that can control the impurity concentration, for example nitrogen concentration, of the SiC crystal. Here, as regards incorporation of nitrogen into the epitaxial layer, it is possible to lower the amount by carrying out growth at a relatively high C/Si ratio depending on the nature of site competition. FIG. 5 shows the relationship between the C/Si ratio during SiC crystal fabrication without intentionally doping and the nitrogen concentration of the obtained SiC crystal. In FIG. 5 when the C/Si ratio is 0.9 or 1.0, while the doping concentration could not be measured because it was too low, from the fact that as C/Si ratio increases the doping concentration tends to fall, it is thought that the nitrogen concentration of the SiC crystal obtained at a C/Si ratio of from 0.8 to 1.0 would be at a minimum. According to the present inventors' experiments, cleanliness of the reactor insides is an obvious requirement as a condition for fabricating a low impurity SiC crystal film, and setting the C/Si ratio, which is a crystal growth condition, to a suitable value is also required. It was learned that when growth is carried out at a growth temperature of 1530° C., growth pressure of 50 Torr and $H_2$ flow amount of 10 litters/minute while varying the C/Si ratio from 0.6 to 0.8, the nitrogen concentration as impurities in the grown crystal can be held down to a relatively low doping concentration of $10^{16}$ cm$^{-3}$, which can be applied in high-voltage SiC semiconductor devices for example, and can be varied from approximately $10^{15}$ cm$^{-3}$ to $10^{13}$ cm$^{-3}$. It was also found that surface morphology was flat when the C/Si ratio was in the range of from 0.9 to 0.6.

Therefore, under the growth conditions according to the present invention, the C/Si ratio when fabricating SiC crystals for a high purity SiC semiconductor device is from 0.1 to 0.6 and more preferably from 0.90 to 0.75. This C/Si ratio condition does not match the conditions for achieving a high probability of micropipe closing (C/Si ratio of 0.6 or less).

However, epilayers employed in the device for high-voltage devices are required not only to be a thick film, but also to have a low doping concentration at the $10^{14}$ cm$^{-3}$ level or less. To obtain such a low-doped level it is necessary to set the C/Si ratio at from 0.8 to 0.9. However, this condition does not match the condition for achieving a high probability of micropipe closing (C/Si ratio of 0.6 or less). Therefore, to obtain a SiC crystal having film property in which the micropipes are closed and which has the desired low doping concentration, growth is started with a low C/Si ratio to grow a buffer layer (a layer with closed micropipes) for closing micropipes, after which a low-doped layer (n layer) at a high C/Si ratio is grown.

From the above, a SiC crystal can be fabricated that has a reduced number of hollow-core defects, called micropipes, that have propagated from the SiC crystal substrate, and have a desired film property by first forming a SiC crystal having a reduced number of hollow-core defects on the crystal surface at a C/Si ratio of 0.8 or less, which is determined by the carbon atom supply limitation, and more preferably a C/Si ratio of 0.6 or less, as a buffer layer (a layer with closed micropipes), then laminating a doping concentration layer (n layer) by epitaxially growing a SiC crystal thereon at a desired C/Si ratio higher than that during the buffer layer formation, of for example approximately 0.8. In the present embodiment the first layer is made a buffer layer, which is a layer with closed micropipes, and the second layer formed thereon is made an active layer, which has a film property having low impurity concentration and easy doping control. However, depending on the circumstances, continuous epitaxial growth can also be carried out by adjusting the C/Si ratio to increase in stages over two or more layers, or adjusting the C/Si ratio to increase gradually and continuously over 2 or more layers. Whichever technique is used, a film property can be obtained in which micropipes are closed, and which has low impurity concentration and easy doping control.

Further, depending on the circumstances, this can also be achieved by crystal growth varying at least two C/Si ratios, forming at an adjusted C/Si ratio in which both of the at least first and second layers are within a range determined by the carbon atom supply limitation (including, for example, where the first layer is 0.35 and the second layer is 0.75 or the reverse thereof), or by adjusting at least one of the layers to be in a range determined by the carbon atom supply limitation. In whichever case, a SiC crystal can be obtained in which micropipes are closed. A desired film property can also be conferred by making the first layer epitaxially grown on a SiC single crystal substrate adjusted with at least two C/Si ratios to be a low C/Si ratio, and the second layer thereon to be a higher C/Si ratio, wherein the first layer layered on the SiC single crystal substrate serves as a buffer layer, and the second layer thereon is not effected by the SiC single crystal substrate.

Suitable examples of the carbon atom-containing material used in the source gas include a saturated or unsaturated hydrocarbon having a carbon atom number of 1 to 4, such as methane, ethane, propane, butane, ethylene, propylene, butylene and acetylene.

Suitable examples of the silicon atom-containing material used in the source gas include monosilane, chlorosilane, dichlorosilane and tetrachlorosilane.

A non-oxidising gas may be employed as the carrier gas for the carbon-containing material and silicon atom-containing material, while use of a deoxidized gas such as hydrogen is preferable.

Figure 2:
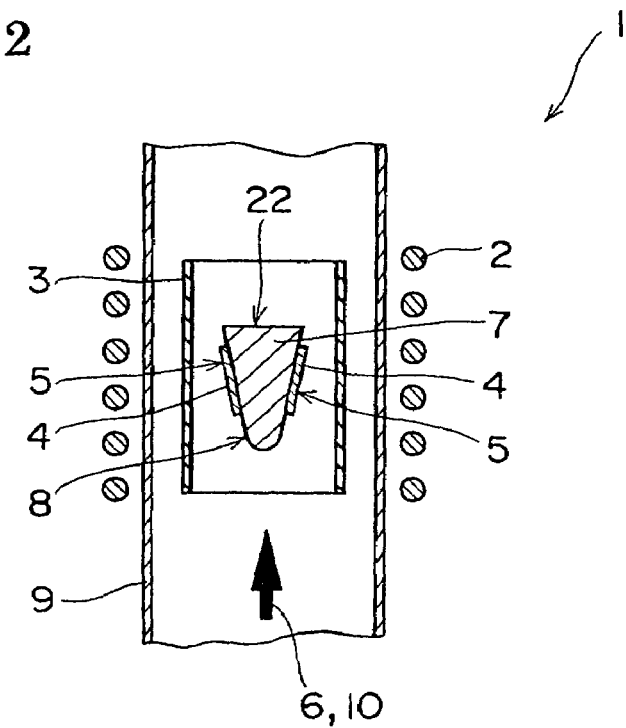
FIG. 2 is a central longitudinal section side-view illustrating a fabrication apparatus employed in the examples of the present invention.

In the embodiments according to the present invention, the fabrication process for this SiC crystal is carried out using the semiconductor device crystal fabrication apparatus 1 shown in FIG. 2. This fabrication apparatus 1 comprises induction heating means 2, a solid radiation part 3 which is inductively heated by the induction heating means 2 and a susceptor 7 which supports a SiC single crystal substrate 4 that is heated by the solid radiation part 3, wherein the SiC single crystal substrate 4 is heated to a higher temperature than the susceptor 7 by solid radiation from the solid radiation part 3 which is inductively heated, so that carbon and silicon atoms in the source gas 6 supplied to a surface 5 of the SiC single crystal substrate 4 are continuously deposited and grown to fabricate the SiC crystal film 11.

This fabrication apparatus 1 comprises substrate support means (hereinafter, "susceptor") 7 provided with a gap between itself and the solid radiation part 3. The susceptor 7 and the SiC single crystal substrate 4 supported thereon are arranged so as to have a gap between them and the solid radiation part 3. Accordingly, the susceptor 7 and the SiC single crystal substrate 4 are heated by solid radiation heat from the solid radiation part 3. Here, because the solid radiation part 3 alone mainly undergoes the induction heating depending on high frequency induction caused by the induction heating means 2, the solid radiation part 3 has the highest temperature in the fabrication apparatus 1, so that the susceptor 7 is at a lower temperature than the solid radiation part 3. From this, the etching effects on the surface 8 of the susceptor 7 can be suppressed, whereby discharge of impurities from the susceptor 7 and deterioration of the coating film of the suspector 7 can be prevented. As a result, crystal growth at a high temperature and a long period can be sought to achieve a high quality crystal.

The fabrication apparatus 1 comprises a reactor tube 9, which distributes source gas 6. The susceptor 7 and the solid radiation part 3 are housed in the interior of the reactor tube 9, wherein they are held so as to be in non-contact with each other by a jig (not shown) and the like.

As the reactor tube 9, for example, a vertical water-cooled double quartz tube is employed. Carrier gas 10 and source gas 6 are introduced from a lower part of the reactor tube 9 and discharged from an upper part thereof as shown by the arrows in the figures. For this reason, when the temperature is high the gases 6, 10 become hotter in the proximity of the SiC single crystal substrate 4 and susceptor 7, whereby even if natural convection occurs in the upwards direction, the flow of gases 6, 10 match the main flow of the natural convection, so that a smooth gas flow can be maintained.

The induction heating means 2 is provided in the periphery of the reactor tube 9. In the present embodiment the induction heating means 2 is an induction coil that is wound around the reactor tube 9. An oscillating frequency of 30 kHz and maximum output of 50 kW high-frequency oscillation, for example, is applied to this induction heating means 2 to inductively heat the solid radiation part 3.

The solid radiation part 3 is made of graphite, and is, for example, a tubular shape arranged in parallel to the reactor tube 9. In the interior of this solid radiation part 3 the susceptor 7 is provided in non-contact therewith by a jig. On the periphery of the solid radiation part 3 a carbon thermal insulation material is provided, whereby the solid radiation part 3 can be heated to approximately 1800° C. or more.

The susceptor 7 is made into a wedge shape, wherein the sharp side tip is arranged towards an upstream side of the gas flow. The SiC single crystal substrate 4 is provided on each of two sloped surfaces 8 of the susceptor 7. Accordingly, the SiC single crystal substrate 4 is supported on the susceptor 7 with its growth surface sloped towards the upstream side of the gas flow, whereby the constituents of the source gas 6 are obliquely sprayed onto the growth surface of the SiC single crystal substrate 4.

The susceptor 7 is made from a SiC-coated graphite. The SiC coating can prevent the release of impurities from the graphite material, whereby a high purity crystal film can be obtained.

The SiC crystal 11 is made in the following manner using the above described fabrication apparatus 1.

First, the growth surface of the SiC single crystal substrate 4 on the susceptor 7 comes into contact with the source gas flow 6, and fixed so that the SiC crystal growth surface is facing towards the upstream side of the source gas flow 6. Next, the interior of the reactor tube 9 is made into a vacuum to remove impurities as much as possible, while the pressure is lowered to 40 to 50 Torr. High frequency oscillation is carried out by induction heating means 2 to inductively heat the solid radiation part 3. The solid radiation part 3 radiates heat so that the SiC single crystal substrate 4 is heated to 1500 to 1600° C. Then, once the surface of the SiC single crystal substrate 4 has been cleaned by etching with hydrogen gas, the carrier gas 10 and the source gas 6 which has been adjusted to a predetermined C/Si ratio to be in a range determined by the carbon atom supply limitation, are distributed. From this, the constituent elements or compounds of the source gas 6 are continuously deposited at the surface 5 of the SiC single crystal substrate 4 and the surface 8 of the susceptor 7. At this time, a SiC crystal 11 grows on the SiC single crystal substrate 4, and during the growth, micropipes dissociate into screw dislocations having a small Burgers vector, and are thereby closed.

The SiC crystal 11 and SiC single crystal substrate 4 obtained in this way do not achieve the highest purity at a C/Si ratio of 0.6, but because a relatively low-doped crystal of $10^{16}$ cm$^{-3}$ or less can be obtained, these crystals may be used as, for example, a high-voltage SiC semiconductor device. It is also possible to remove the SiC single crystal substrate 4 from the SiC crystal 11 that has been formed and to use the remaining SiC crystal 11 alone as a SiC single crystal substrate. In such a case, a SiC single crystal substrate having a low micropipe 13 content probability can be obtained. If a semiconductor device is fabricated using this SiC crystal 11, better performance of the breakdown voltage property for the semiconductor device, expansion of the usable area and improved yield can be expected.

The SiC crystal according to the present invention is a SiC crystal fabricated from the above described fabrication process. Namely, it is a SiC crystal in which the number of hollow-core defects that have propagated from the SiC single crystal substrate are reduced, and is a SiC crystal in which the number of hollow-core defects that have propagated from the SiC single crystal substrate are reduced and which has a desired film property. These SiC crystals may be preferably used as a SiC single crystal film, a SiC semiconductor device, a SiC single crystal substrate and a seed crystal for SiC bulk fabrication.

The SiC single crystal film according to the present invention is a SiC single crystal film having a reduced number of hollow-core defects that have propagated from the substrate formed on a SiC single crystal substrate having hollow-core defects according to the fabrication process of the above described SiC crystal, and that has a desired film property.

The SiC single crystal film may be a layered SiC single crystal film formed by readjusting the C/Si ratio to an appropriate value to obtain a doping concentration-controllable film property and then epitaxially growing SiC crystals, onto layered SiC crystals epitaxially grown by step-flow mode onto a SiC single crystal substrate having hollow-core defects. Here, the change in the C/Si ratio during micropipe closing and when obtaining the doping concentration-controllable film property may be carried out in stages or may be changed gradually.

Further, the SiC single crystal film may be a single crystal film on the SiC single crystal substrate having hollow-core defects used in the fabrication thereof, and may also be an independent single crystal film from which the SiC single crystal substrate having hollow-core defects has been removed.

The SiC semiconductor device according to the present invention is a semiconductor device doped with the predetermined concentration dopant in the SiC single crystal film according to the above-described present invention. Examples of the dopant include n-type semiconductor devices doped with nitrogen, phosphorous and the like and p-type semiconductor devices doped with aluminum, boron and the like. Specifically, the present SiC semiconductor device is an n-type SiC semiconductor device doped with a predetermined concentration of nitrogen as the dopant in the SiC single crystal film. These SiC semiconductor devices can be preferably employed as the semiconductor device for power devices operating at high temperatures.

The SiC single crystal substrate according to the present invention is a substrate which comprises the above described SiC single crystal film. The substrate may be an independent SiC single crystal film, or it may comprise the SiC single crystal substrate having hollow-core defects used in fabrication of the SiC single crystal film.

Figure 11A:
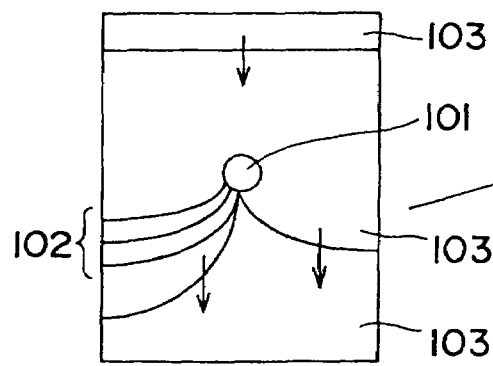
Figure 11B:
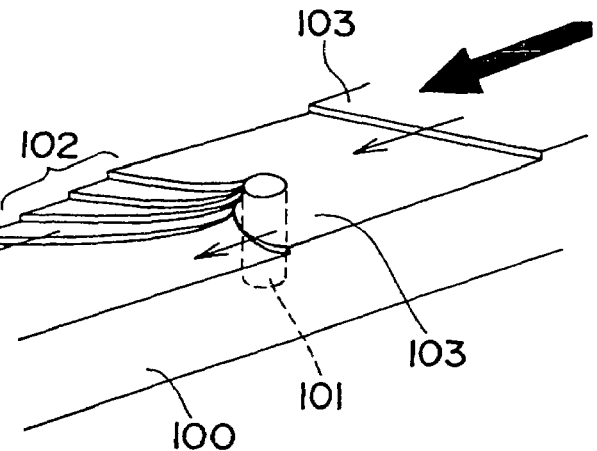
Figure 12A:
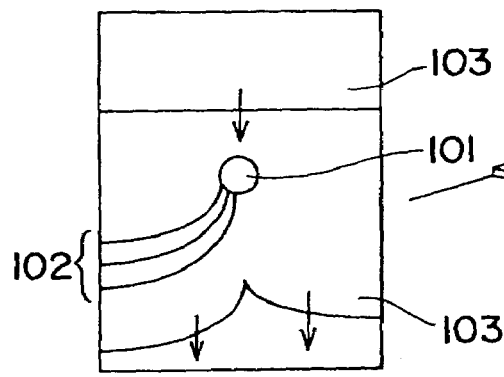
Figure 12B:
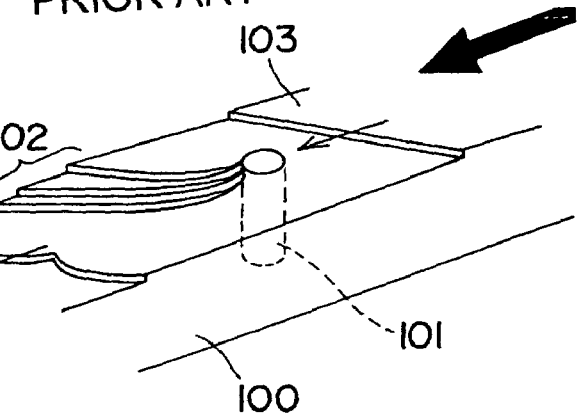

These SiC single crystal substrates, as long as the hollow-core defects are not exposed on the single crystal surface, have a high breakdown voltage exceeding a reverse voltage of 1000 V even when hollow-core defects are present in the substrate interior, as compared to the device containing continuous micropipes as shown in FIG. 11, which broke down at 200 to 300 V. These substrates can therefore be preferably employed as the substrate for power devices that have high breakdown voltage, low-loss and are operable at high temperatures.

The electronic device according to the present invention is a device mounted with an electronic element on the SiC single crystal substrate. As described above, because SiC single crystal films have very high breakdown voltage, they can be employed as power devices having high breakdown voltage, low-loss and which are operable at high temperatures.

The fabrication process of the SiC bulk crystal according to the present invention is characterized in employing the above-described SiC crystal as the seed crystal in various SiC bulk crystal fabrication processes.

As described above, because the SiC crystal has a reduced number of micropipes, using such a crystal as the seed crystal allows for a SiC bulk crystal having a small micropipe density to be obtained. For example, for a fabrication process of SiC bulk crystal by sublimation deposition, in a graphite crucible, a seed crystal comprising the above described SiC crystal is charged into a bottom portion of the crucible and a solid SiC material is charged into an upper portion of the crucible, whereby the solid SiC is heated to sublime at a sublimation temperature (to 2400° C.), wherein recrystallation is carried out by the seed crystal which is maintained at a temperature lower than the sublimation temperature due to a temperature gradient in the crucible for growing a SiC bulk crystal. During this process SiC powder, SiC polycrystals and SiC single crystals can be used as the solid source SiC. Further, by adding an Si-containing material or a C-adsorbing Ta and the like to these solid SiC materials, the C/Si ratio in the crucible can be adjusted for growing a SiC bulk crystal at a desired crystal growth rate adjusted to a range which is determined by the carbon atom supply limitation.

In addition to sublimation deposition, the seed crystal can also be employed in a SiC bulk crystal fabrication process by high-temperature CVD and the like. While the above described embodiment is one example of a preferable embodiment according to the present invention, the present invention is not restricted to this embodiment, and can be variously modified for use without departing from the gist of the present invention. For example, because most commercially available SiC single crystal substrates are off 8° substrates, the present embodiment mainly explained step-flow mode crystal growth and micropipe closing. However, even when crystal growth is carried out by spiral growth, if crystal growth is carried out by adjusting the C/Si ratio in the source gas so that the crystal growth rate is in a range determined by the carbon atom supply limitation, micropipes will close in the same manner during the growth phase. Spiral growth and step-flow growth are effected by the off angle, wherein spiral growth is the main growth mode of surface growth for those having no off angle (0°) or a vicinal angle (0.05°) and the like. Therefore, as the off angle becomes larger, step-flow becomes relatively stronger in relation to spiral growth.

The following mechanism was speculated regarding micropipe closing by varying the C/Si ratio from a surface morphological observation experiment and crystallographic analysis when the C/Si ratio was varied from 0.6 to 0.9 using a 8° off (0001) silicon face SiC substrate.

First, a large number of steps 12 are present on the surface of the (0001) Si face SiC substrate fixed at an off angle, as shown in FIG. 14 and FIG. 3. The steps 12 performs step-flow growth by crystal growth progressing in one direction (arrow direction). Further, in the vicinity of micropipe 13, which is a large screw dislocation, spiral growth steps 14 derived from the micropipe perform spiral growth.

In the vicinity of microscope 13, where step-flow growth and spiral growth coexist, the growth mode varies depending on the relationship of the relative speed. The predominant growth mode is decided by the difference per unit time in the total number of the step-flow steps 12 passing through the micropipe 13 and the total number of the spiral growth steps 14 (the rotational frequency of the step number of the spiral growth steps 14), which are growing while rotating about the micropipe 13.

If the C/Si ratio is made smaller, the total number of step-flow steps 12 passing through the micropipe 13 per unit time is relatively greater than the total number of the steps generated by the micropipe per unit time, meaning that crystal growth proceeds with step-flow growth being the predominant surface growth mode. Thus, it can be thought that because the interaction between the step-flow steps 12 and the micropipe 13 becomes stronger, micropipe closing occurs at a greater probability.

In contrast, if the C/Si ratio is made larger, the total number of step-flow steps 12 passing through the micropipe 13 per unit time is relatively smaller than the total number of the steps generated by the micropipe per unit time, meaning that crystal growth proceeds with surface spiral growth being the predominant surface growth mode. Thus, it can be thought that because the interaction between the step-flow steps 12 and the micropipe 13 weakens, it becomes harder for micropipe closing to occur.

This phenomenon can also be expressed using the following expanded description. Micropipes propagate from the substrate basically parallel to the c axis of the crystal, so that micropipes propagate by spiral growth along the c axis. Further, the c plane having a perpendicular positional relationship with the c axis grows in a direction that expands the c plane, wherein a step, which is at the edge of the plane, progresses parallel to the crystal surface independently of the micropipe.

Therefore, by making the total number of spiral growth steps generated by the micropipe per unit time greater than that of parallel c plane edge steps passing through the micropipe portion appearing on the crystal surface, spiral growth predominance can be suppressed, whereby micropipe continuation can be hindered. It is thought that the relative rate of these spiral growth steps can be lowered by making the C/Si ratio smaller, so that carrying out growth at a small C/Si ratio is effective in causing the chances of micropipe closing to increase. This fact holds for any off angle and any orientation.

While the present embodiment employs a fabrication apparatus 1 heated by solid radiation obtained using induction heating from a solid radiation part 3 which is provided with a gap between the heat of the SiC single crystal substrate and the substrate, the apparatus is not restricted thereof and may also be employed by heating the SiC single crystal substrate 4 using direct induction heating of the susceptor supporting the SiC single crystal substrate 4. Further, a CVD apparatus can also be employed that satisfies the growth conditions of the above-described apparatus 1, such as growth pressure and growth temperature.

EXAMPLES

The present invention will now be further explained in detail using the examples and comparative examples.

Example 1

A SiC crystal 11 was fabricated by epitaxial growth using a radiant heating reactor, which is a vertical hot-wall CVD, which employed the fabrication apparatus illustrated in FIG. 2. The temperature at a top face 22 of a susceptor 7 was measured by a pyrometer via a quartz window arranged on an upper part of the reactor tube 9. This temperature measured by the pyrometer was set as the growth temperature. The growth temperatures given below are all, therefore, the measured temperatures of a top face 22 of the susceptor 7.

As the SiC single crystal substrate 4, a commercially available 8° off 4H—SiC (0001) substrate (manufactured by Cree, Inc) having a diameter of 50 mm was cut into a predetermined size (¼) for use. The SiC single crystal substrate 4 was set on the susceptor 7 in the reactor, and the remaining gases in the reactor were evacuated to create a vacuum of $10^{-7}$ Torr or below. Hydrogen gas only was then charged into the reactor, wherein the surface of the SiC single crystal substrate 4 was subjected to high temperature hydrogen etching at a pressure of approximately 30 Torr and temperature of 1400° C. The reactor was subsequently adjusted to a temperature of 1500° C. and pressure of 50 Torr, then a source gas 6 of monosilane and propane was supplied in addition to hydrogen carrier gas 10. The C/Si ratio of the monosilane (30 sccm) and propane (6 sccm) was adjusted to approximately 0.6 to grow the SiC crystal 11.

Using the above-described procedure, 4H—SiC was rapidly grown, and SiC crystal surface electron microscope photographs of the surface of the SiC crystal 11 after it had been grown, and the condition of the defect at the same place of the surface of the SiC single crystal substrate 4 after the SiC crystal 11 had been removed, were taken and compared. The defect was made visible by chemically treating each of the surfaces and then etching. The results are shown in FIG. 6. FIG. 6A illustrates the surface of the SiC crystal 11 after crystal growth. FIG. 6B illustrates the surface of the SiC single crystal substrate 4 after the SiC crystal 11 surface had been removed.

As illustrated in FIG. 6A, a plurality of screw dislocations was confirmed. As illustrated in FIG. 6B, it was found that micropipe defects were present in the SiC single crystal substrate 4 from the fact that hexagonal etch pits could be seen. Therefore, it was confirmed that SiC single crystal substrate micropipe defects were dissociated into screw dislocations.

Thus, according to the fabrication process of a SiC crystal in accordance with the present invention, it is clear that micropipes having been present in the SiC single crystal substrate 4 are closed at a C/Si ratio of 0.6, where the crystal growth rate is determined by the carbon atom supply limitation.

Example 2

SiC crystals were layered under the same conditions as those in Example 1, except for the C/Si ratio of the source gas 6 being changed to be in a range from 0.4 to 1.0, wherein the nitrogen concentration, which was the impurity concentration, of the SiC crystals was measured when the C/Si ratio was changed to be in the range of from 0.4 to 1.0. The results are shown in FIG. 5. As illustrated in FIG. 5, under the above-described conditions the optimal range for the C/Si ratio in which the nitrogen concentration, as impurities, is at a minimum is from 0.8 to 0.9. When the C/Si ratio is lower than that at 0.4 to 0.7, the nitrogen concentration increases as the C/Si ratio decreases. When the C/Si ratio is higher than that at 1.0 or more, semiconductor device properties switched from being n-type to p-type. It was therefore learned that for an epilayer to be used for an n-type high-voltage device, a suitable range for the C/Si ratio was from 0.6 to 0.9 in which the formed SiC crystal was maintained at a preferable low-doped nitrogen concentration of $10^{15}$ $cm^{-3}$ or below. Furthermore, it was learned that a suitable range for a SiC 11 having a relatively flat surface to be formed was from approximately 0.5 to 0.9.

Therefore, it is clear that with this fabrication apparatus 1, if the C/Si ratio is within the range of approximately 0.6 to 0.9, there are no practical problems in terms of impurity concentration and surface morphology.

Example 3

SiC crystals 11 were grown by varying the C/Si ratio from 0.6 to 0.9 while keeping the other conditions the same as in Example 1, for investigating the closing probability of micropipe 13 that existed on the SiC substrate. The results are shown in FIG. 4A. From FIG. 4A it can be seen that although the closing probability is less than 1% when the C/Si ratio was approximately 0.9, when the C/Si ratio was lowered, whereby the conditions were made to be excess in Si, the probability of micropipe closing rose, so that at 0.6 the closing probability was 99% or more.

Therefore, it is clear that with this fabrication apparatus 1 a very suitable SiC crystal 11 for use in a semiconductor device can be obtained when the C/Si ratio is 0.6, which is determined by the carbon atom supply limitation, because the closing probability reaches 99% or more, and from the results of Example 2 there are no problems with surface morphology.

Example 4

Under the same conditions as those in Example 3, the C/Si ratio was further widened to a range of from 0.4 to 1.0 to form a SiC crystal 11 for further investigation into the relationship between C/Si ratio, and the closing probability of the micropipes 13 present on the SiC substrate and crystal growth rate. Those results are shown in FIG. 4B. As shown in FIG. 4A, it was discovered that in the range beyond a C/Si ratio of 0.8, the growth rate was saturated and almost fixed; when the C/Si ratio is decreased to 0.8, it is determined by the carbon atom supply limitation; and at 0.8 or below crystal growth rate was reduced by the carbon atom supply limitation.

Example 5

Under the same conditions as those in Example 1, a crystal layer, which serves as a buffer layer, was formed on the SiC single crystal substrate 4 with a C/Si ratio even lower than that in Example 1 of 0.5. A device was then fabricated using a 2-layer structure wherein a low-doped crystal was grown at a C/Si ratio of 0.8, which ratio prepares crystal having the highest purity. From the results of Examples 3 and 4, it was understood that even if the buffer layer was formed at a C/Si ratio of 0.35, 0.5 and the like, which were lower than 0.6, there would be micropipe closing effects. Even if the crystal used in the device was changed back to a higher C/Si ratio value, such as 0.8, to lower the dopant concentration, it was confirmed that there was no replication of micropipes. In addition, using such a 2-layered crystal to fabricate a large surface area Schottky diode having a diameter of 11.2 mm (surface area of approximately 1 $cm^2$), a reverse voltage of more than 1 kV was achieved in spite of closed micropipes being contained therein.

Example 6

Figure 8:
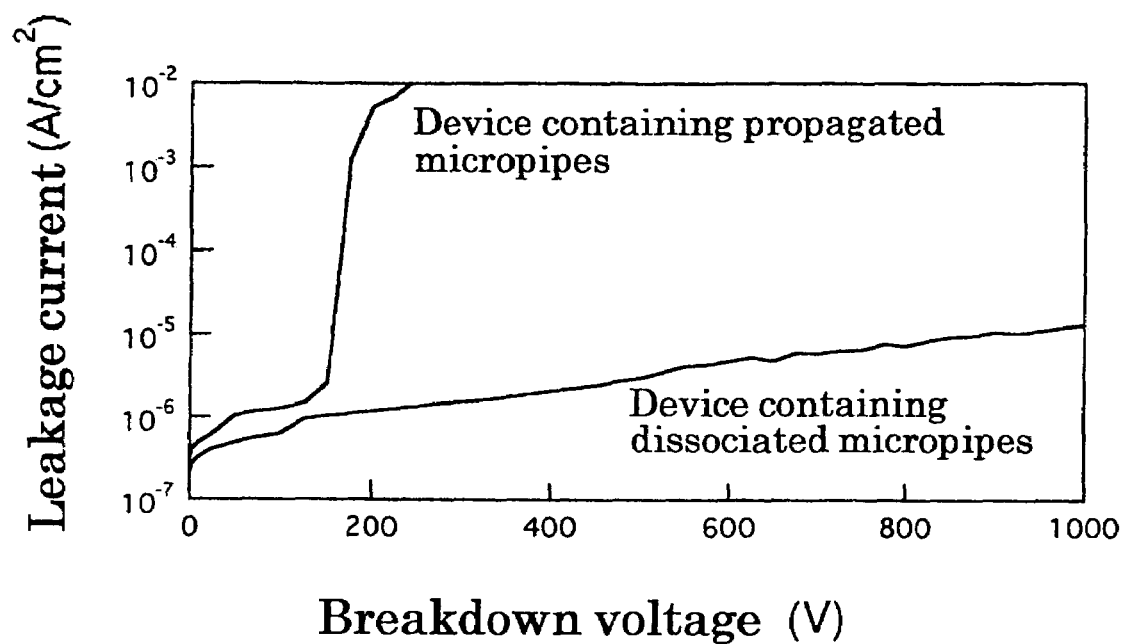
FIG. 8 is a graph illustrating the relationship between breakdown voltage and leakage current for a Schottky diode.
Figure 9A:
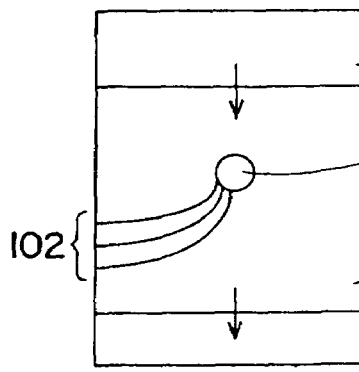
Figure 9B:
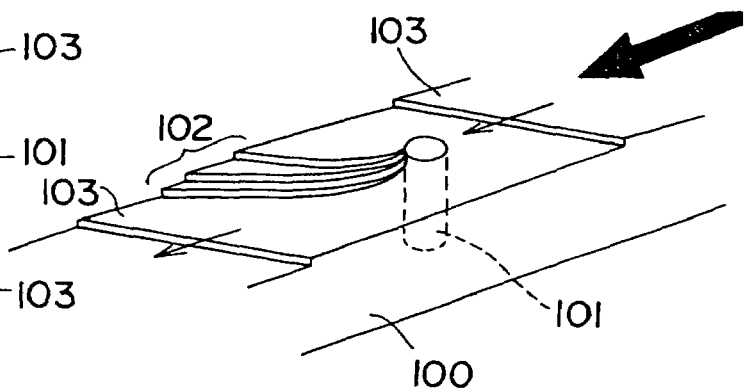
Figure 10A:
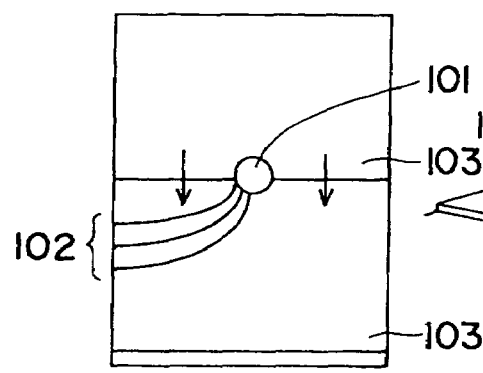
Figure 10B:
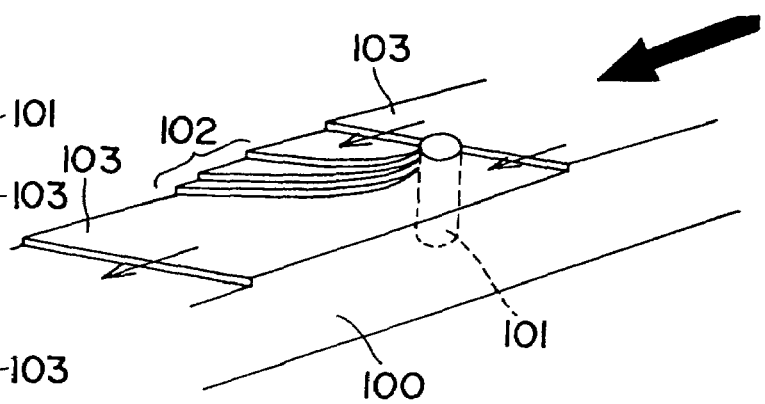

Under the same conditions as those in Example 1, a Schottky diode was fabricated on the surface of defect-reduced Ni/4H—SiC prepared at a C/Si ratio of 0.8 using a fabricating apparatus 1, which had a film thickness of 21 µm, doping concentration of $5\times10^{15}$ $cm^{-3}$ and a diameter of 0.5 mm. The current-voltage characteristics of the diode were evaluated, the results of which are shown in FIG. 8 as a graph of the relationship between breakdown voltage and leakage current. This diode with closed micropipes did not breakdown at a reverse voltage up to 1000 V.

Comparative Example 1

Figure 7A:
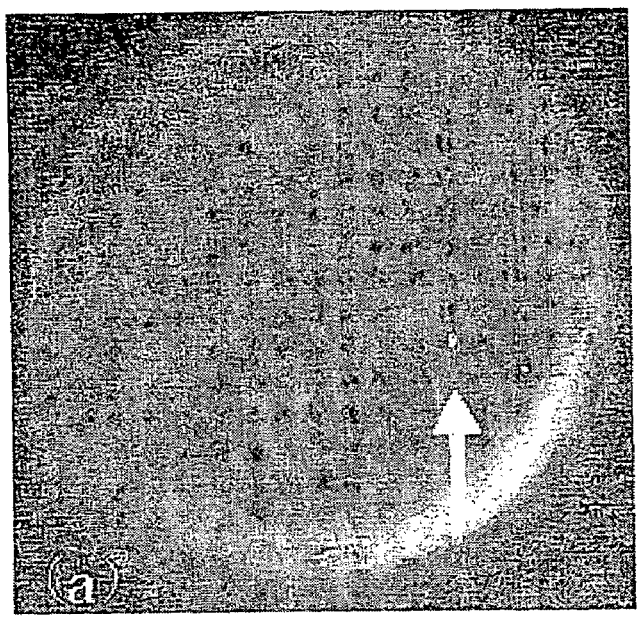
Figure 7B:
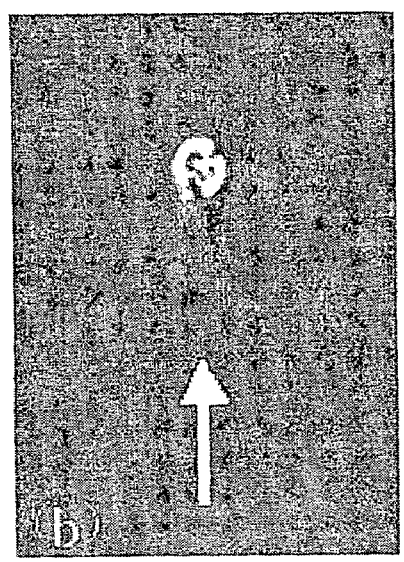

A Schottky diode was fabricated on the surface of a SiC crystal having a film thickness of 21 µm, doping concentration of $5\times10^{15}$ $cm^{-3}$ and a diameter of 0.5 mm, and which contained micropipes continuing until the Ni/4H—SiC surface, and the current-voltage characteristics of the diode were evaluated. The results are shown in FIG. 8 as a graph of the relationship between breakdown voltage and leakage current. The condition before evaluation is shown in FIGS. 7A and 7B. In the figures the arrows denote micropipes.

Figure 7C:
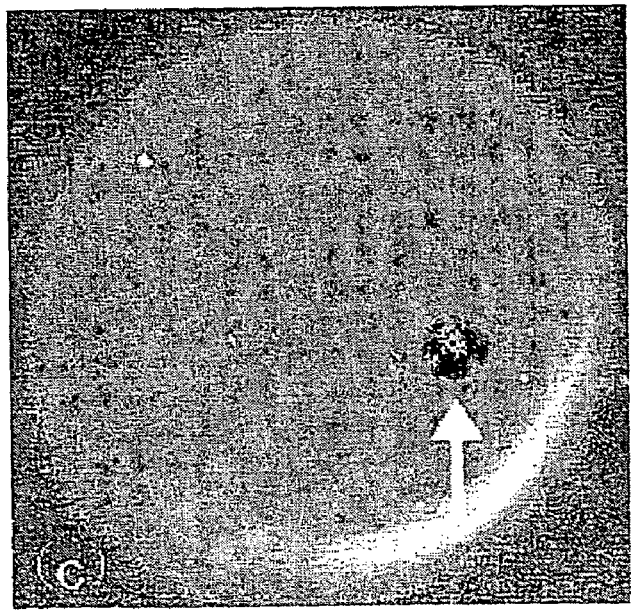

This diode broke down in a low region of a reverse voltage of 400 V or less. It was also found that the break down points were portions where micropipes were present (FIG. 7C). Therefore, it was confirmed that if even a single micropipe was contained in the semiconductor device, the entire device would not function due to breakdown.

It was confirmed from the results of the above described Example 5 and Comparative Example 1 that the reverse bias blocking performance of the points where micropipes had closed due to crystal growth were greatly improved.

Example 7

The C/Si ratio also influences surface smoothness of the epilayer. In the vertical hot-wall reactor in which the experiment was carried out, under conditions of about C/Si=0.8, a smooth epilayer surface was obtained, which had an average surface roughness (RMS) of approximately 0.2 nm (measured results of surface roughness in the region of 10 µm using an atomic force microscopy). However, when an epilayer was grown at C/Si=0.4 having a film thickness of 15 µm, roughness having a height of 1 to 3 nm were observed on the surface at intervals of several µm. The average surface roughness was determined to be 0.37 nm. It was therefore confirmed that if growth is propagated at such a low C/Si ratio, the surface average surface roughness tends to increase. In contrast, a layer with closed micropipes having a film thickness of 6 µm was formed under conditions of C/Si=0.35, then an n-layer was formed having a film thickness of 38 µm under conditions of C/Si=0.8. In this case a smooth surface was obtained having an average surface roughness of 0.25 nm (average value of 20 points within the 2-inch wafer surface).

It was confirmed from this that it is possible to obtain a micropipe-reduced smooth surface by growing a layer with closed micropipes having a film thickness of several µm at a low C/Si ratio, then carrying out growth at an appropriate C/Si ratio.

Example 8

Growth was carried out under the same conditions as those for Example 1, except for the C/Si ratio, wherein after growing at a low C/Si ratio (C/Si=0.6) to a film thickness of 45 µm, growth was carried out at a high C/Si ratio (C/Si=0.9) continuously to a film thickness of 40 µm. From this it was confirmed that micropipes that closed in the region of C/Si=0.6 did not replicate in the region of C/Si=0.9.

Example 9

Under the same conditions as those in Example 1, except for the C/Si ratio, a high purity layer having a film thickness of 210 µm was grown onto a layer with closed micropipes having a doping concentration of $5 \times 10^{18}$ cm$^{-3}$ by continuously forming a first layer, serving as a buffer layer (a layer with closed micropipes), at C/Si=0.4 and growth rate of 7 µm/h to a film thickness of 7 µm, then continuously forming on top of this a second layer, serving as the high purity layer, at C/Si=0.8 and growth rate of 15 µm/h to the film thickness of 210 µm. From this a wide region of several mm$^2$ was obtained in which surface defects could not be observed. It was confirmed that a good surface could be obtained even when film thickness growth was carried out on the a layer with closed micropipes to 200 µm or more. This is meaningful in that in order to obtain an ultra-high voltage device having a breakdown voltage of 10 kV or more, a thick and low-doped epitaxial layer is required.

Example 10

Under the same conditions as those in Example 1, except for the C/Si ratio, crystal growth was carried out at a C/Si ratio=0.4, and nitrogen doped at $5 \times 10^{18}$ cm$^{-3}$. As a result, a probability of micropipe closing of 99.60% was obtained. Of 304 micropipes 303 had closed. In addition, a 2-inch wafer was obtained wherein the micropipe density which penetrated the epitaxial layer from the substrate was 0.3 cm$^{-2}$ or less.

Example 11

Under the same conditions as those in Example 1, except for the C/Si ratio, crystal growth was carried out at a C/Si ratio=0.5. A probability of micropipe closing of 95% or more was obtained for nitrogen doping in a wide region of from the lower half of $10^{15}$ cm$^{-3}$ to the lower half of $10^{19}$ cm$^{-3}$, whereby high concentration doping and high closing probability were simultaneously obtained. A SiC single crystal substrate having a SiC crystal or crystal film with such high concentration doping and high closing probability is effective in reducing resistance (loss) in a device when current flows in a forward direction.

Example 12

Under the same conditions as those in Example 1, except for the C/Si ratio, a first layer was grown at a higher C/Si ratio of 0.9 to a thickness of 44 µm, and a second layer was grown at a lower C/Si ratio of 0.6 to a thickness of 44 µm. According to such a double-layer crystal growth, even at a position separated from the interface between the substrate and the first epilayer, micropipes could be effectively closed by adjusting the C/Si ratio. Furthermore, even if micropipe closing cannot be controlled for high purity, low concentration doping in which the amount of impurities is extremely low, this method can provide a thick SiC crystal film having a high probability of micropipe closing faster than when a film is formed only with a low C/Si ratio of 0.6 over the whole thickness and is thus effective when obtaining a high resistance substrate.

INDUSTRIAL APPLICABILITY

As described above, in accordance with the fabrication process according to the present invention, a SiC crystal can be fabricated which has a reduced number of hollow-core defects, called micropipes, on the crystal surface. In addition, a desired film property can be conferred to this SiC crystal.

The SiC crystal fabricated by the fabrication process according to the present invention has a reduced number of hollow-core defects, and has a desired film property, and can therefore be preferably employed as a single crystal film for a semiconductor device for power devices which operate at high temperatures, and as a single crystal for power devices that have high breakdown voltage, low-loss and that operate at high temperatures. As a result of the reduced number of micropipes, a semiconductor device can be obtained that seeks to enlarge the usable surface area and increase yield. Further, provided are a SiC semiconductor device for a power device employing these SiC single crystal films, a SiC single crystal substrate and a power device employing the single crystal substrate.

The SiC crystal can also be preferably used as a seed crystal for SiC bulk crystal fabrication, wherein a SiC bulk crystal can be fabricated according to the fabrication process of a SiC bulk crystal that uses such a seed crystal, which does not have any hollow-core defects, called micropipes.

The invention claimed is:

1. A fabrication process of a SiC crystal, the process epitaxially grows a SiC crystal at a pressure of 1–1000 Torr and a temperature of 1400° C. or higher onto a SiC single crystal substrate having hollow-care defects, called micropipes, by supplying a source gas which contains in a carrier gas a carbon atom-containing substance and a silicon atom-containing substance, characterized in that:

a number ratio of the carbon to silicon atoms (C/Si ratio) in the source gas is adjusted to be in such a range that crystal growth rate is determined by carbon atom supply limitation, a plurality of layers of the SiC crystal are epitaxially grown and layered, wherein hollow-core defects having been present in the substrate dissociate into a plurality of dislocations given by small Burgers vector without any hollow-cores, whereby hollow-core defects that have been present in the substrate do not propagate to a surface of the SiC crystal.

2. The fabrication process of a SiC crystal according to claim 1, wherein epitaxial growth is carried out by adjusting into at least two C/Si ratios.

3. The fabrication process of a SiC crystal according to claim 2, wherein the at least two C/Si ratios are a C/Si ratio for epitaxially growing a first layer on the SiC single crystal substrate and a higher C/Si ratio for epitaxially growing a second layer thereon.

4. The fabrication process of a SiC crystal according to claim 2, wherein the first layer layered on the SiC single crystal substrate is made as a buffer layer, and the second layer thereon is epitaxially grown and layered under a supply condition of a source gas in which the C/Si ratio is adjusted to be in a higher growth direction than that of the C/Si ratio when forming the buffer layer, wherein a desired film property is conferred.

5. The fabrication process of a SiC crystal according to claim 4, wherein the first layer is a buffer layer and the second layer is an active layer.

6. The fabrication process of a SiC crystal according to claim 1, wherein the dislocations given by small Burgers vector without hollow-cores are screw dislocations, edge dislocations or partial dislocations.

7. The fabrication process of a SiC crystal according to claim 1, wherein the temperature is from 1400 to 2400° C. and the C/Si ratio is 0.8 or less.

8. The fabrication process of a SiC crystal according to claim 7 wherein the pressure is from 10 to 250 Torr, the temperature is from 1500 to 1750° C. and the C/Si ratio is from 0.75 to 0.35.

9. The fabrication process of a SiC crystal according to claim 4, wherein the pressure is from 1 to 1000 Torr, the temperature is from 1400 to 2400° C. and the C/Si ratio during the buffer layer formation is from 0.75 to 0.35, while the C/Si ratio when the desired film property is conferred is from 0.8 to 0.9.

10. A SiC crystal grown into a SiC single crystal substrate according to the fabrication process of a SiC crystal of claim 1, wherein the micropipes, propagating from the SiC substrate to the epitaxial layers, are closed by dissociating the micropipes into a plurality of dislocations that are not hollow-cores in the epitaxial layers.

11. The SiC crystal according to claim 10, wherein a density of hollow-core defects that have propagated from the substrate to a surface of the crystal is 0 or 1/cm$^2$ or less.

12. The SiC crystal according to claim 10, wherein the density of hollow-core defects that have propagated from the substrate to the crystal surface is repeatedly 50% or less of the density in the substrate.

13. The SiC crystal according to claim 12, wherein the density of hollow-core defects that have propagated from the substrate to the crystal surface is 20% or less of the density in the substrate.

14. A SiC crystal grown into a SiC single crystal substrate according to the fabrication process of a SiC crystal of claim 1, wherein the SiC crystal includes a SiC crystal at least as a buffer layer in which the micropipes, propagating from the SiC substrate to the epitaxial layers, are closed by dissociating the micropipes into a plurality of dislocations that are not hollow-cores in the epitaxial layers.

15. A SiC crystal grown into a SiC single crystal substrate according to the fabrication process of claim 2, wherein the picropipes, propagating from the SiC substrate to the epitaxial layers, are closed by dissociating the micropipes into a plurality of dislocations that are not hollow-cores in the epitaxial layers, and wherein epitaxial growth is carried out by adjusting into at least two C/Si ratios.

16. The SiC crystal according to claim 15, wherein the desired film does not contain impurities above a selected amount which have the SiC crystal function as a semiconductor.

17. The SiC crystal according to claim 15, wherein the desired film is doped with a selected amount of a dopant.

18. A SiC single crystal film comprising a SiC crystal grown into a SiC single crystal substrate according to the fabrication process of claim 1, wherein micropipes, propagating from the SiC substrate to epitaxial layers, are closed by dissociating the micropipes into a plurality of dislocations that are not hollow-cores in the epitaxial layers, and the SiC single crystal film is formed on the SiC single crystal substrate.

19. The SiC single crystal film according to claim 18, wherein the SiC single crystal film is an independent SiC single crystal film in which the SiC single crystal substrate has been removed.

20. The SiC single crystal film according to claim 18, wherein the desired film does not contain impurities above a selected amount which have the SiC crystal function as a semiconductor.

21. The SiC single crystal film according to claim 18, wherein the desired film is doped with a selected amount of a dopant.

22. A SiC semiconductor comprising the SiC single crystal film according to claim 18, characterized in containing a dopant at a controlled concentration.

23. The SiC semiconductor according to claim 22, wherein the dopant is nitrogen, the SiC semiconductor is an n-type semiconductor containing the nitrogen at a selected concentration.

24. A SiC single crystal substrate characterized in comprising the SiC single crystal film according to claim 18.

25. An electronic device characterized in comprising the SiC single crystal substrate according to claim 24 and an electronic element that is mounted on said substrate.

26. The electronic device according to claim 25, wherein the electronic element is a Schottky diode.

27. A fabrication process of a SiC bulk crystal characterized in using the SiC crystal according to claim 10 as a seed crystal.

28. The fabrication process of a SiC bulk crystal according to claim 27, wherein the fabrication process of a SiC bulk crystal is sublimation deposition or high-temperature CVD.

* * * * *